US006612890B1

(12) United States Patent  
Radloff

(10) Patent No.: US 6,612,890 B1
(45) Date of Patent: Sep. 2, 2003

(54) METHOD AND SYSTEM FOR MANUFACTURING ELECTRONIC PACKAGING UNITS

(75) Inventor: Robert Peter Radloff, Corona, CA (US)

(73) Assignee: Handy & Harman (NY Corp.), Rye, NY (US)

( * ) Notice: Subject to any disclaimer, the term of this patent is extended or adjusted under 35 U.S.C. 154(b) by 118 days.

(21) Appl. No.: 09/714,992

(22) Filed: Nov. 20, 2000

Related U.S. Application Data

(60) Continuation-in-part of application No. 09/559,545, filed on Apr. 28, 2000, now Pat. No. 6,220,915, which is a division of application No. 09/172,760, filed on Oct. 15, 1998, now Pat. No. 6,087,195.

(51) Int. Cl.$^7$ ............................................. B29B 44/14
(52) U.S. Cl. ..................... 445/24; 172/52.4; 361/806; 264/272.14; 264/277
(58) Field of Search .................... 445/24; 264/645, 264/272.14, 277; 174/52.4; 257/691, 692, 700; 438/26; 361/820, 806

(56) References Cited

U.S. PATENT DOCUMENTS

| | | | | | |
|---|---|---|---|---|---|
| 5,403,784 | A | * | 4/1995 | Hashemi et al. | 29/827 |
| 5,410,180 | A | * | 4/1995 | Fujii et al. | 257/666 |
| 5,909,037 | A | * | 6/1999 | Rajkomar et al. | 257/100 |
| 6,087,195 | A | * | 7/2000 | Radloff | 438/22 |
| 6,220,915 | B1 | * | 4/2001 | Radloff | 425/123 |

* cited by examiner

Primary Examiner—Kenneth J. Ramsey

(57) ABSTRACT

A method and system for fabricating electronic packaging units which include a molded body and a plurality of electrically conductive leads protruding therefrom. The packaging units are made by overlaying lead frames having leads and then depositing molding material on the leads. The packaging units are manufactured in an assembly line process which includes a feeder to feed the lead frames and a molder to deposit the molding material.

30 Claims, 15 Drawing Sheets

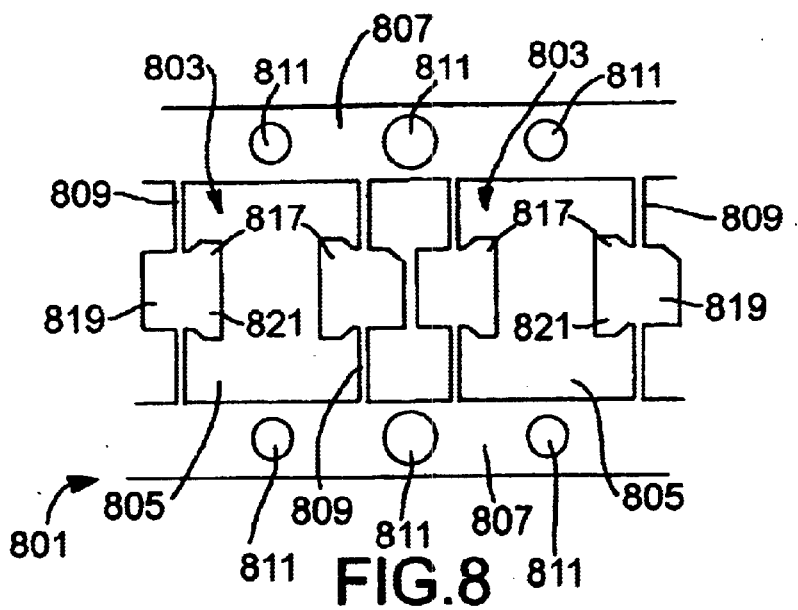
FIG.8
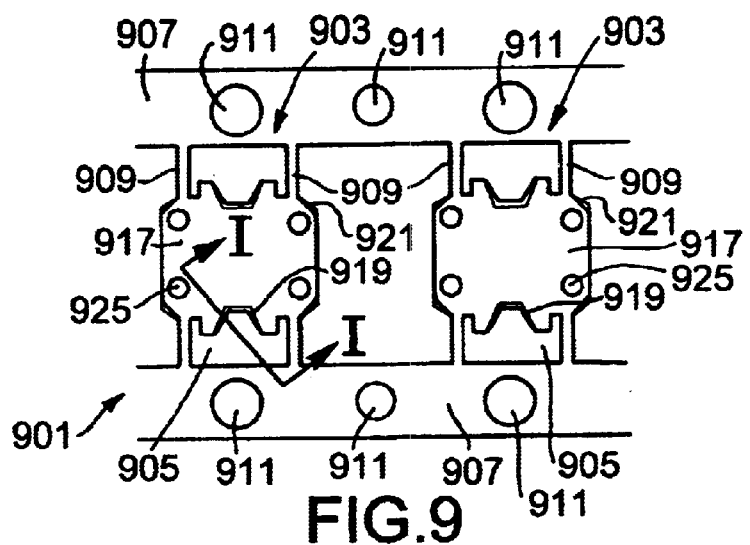
FIG.9
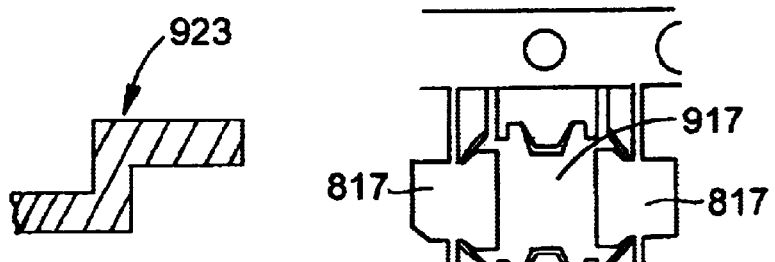
FIG.10
FIG.11

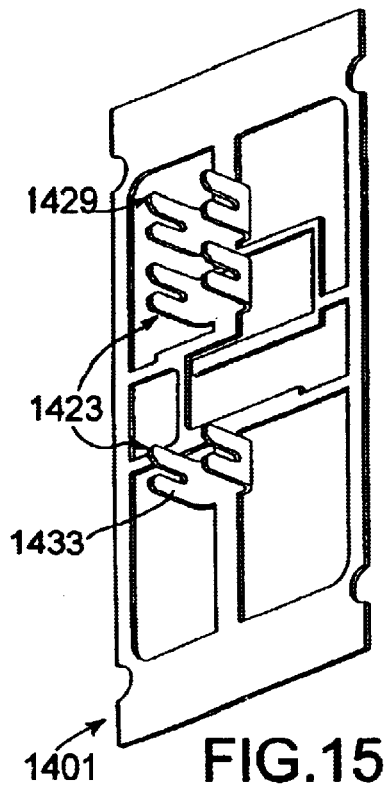
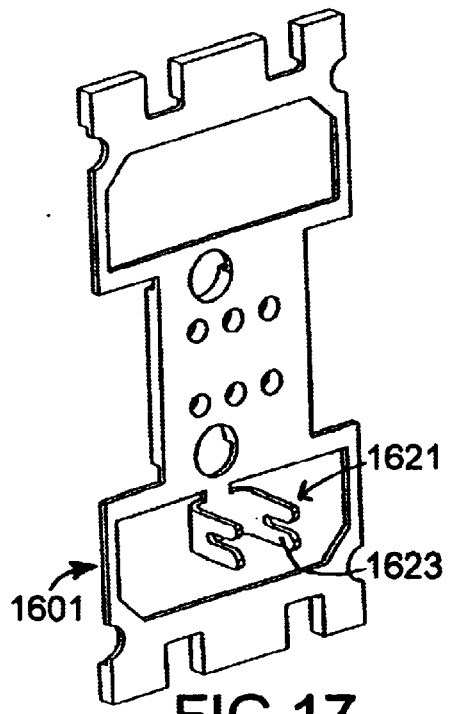
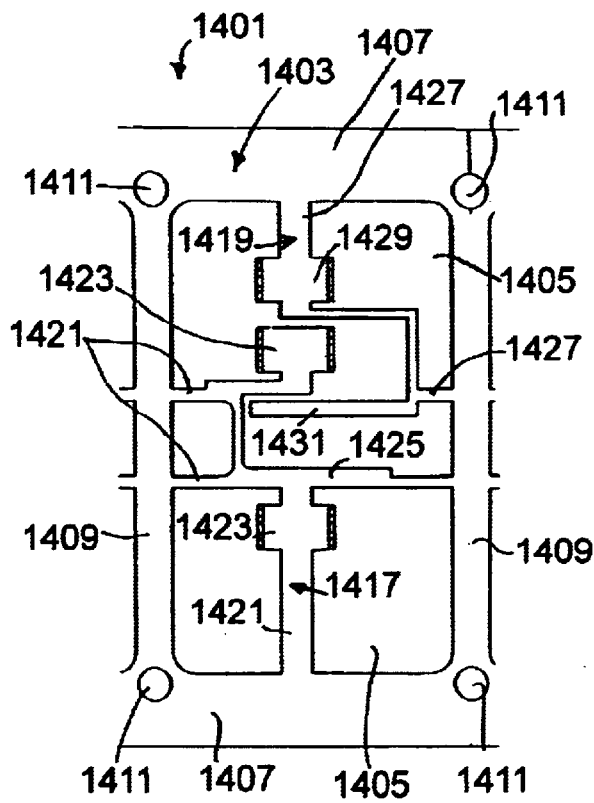
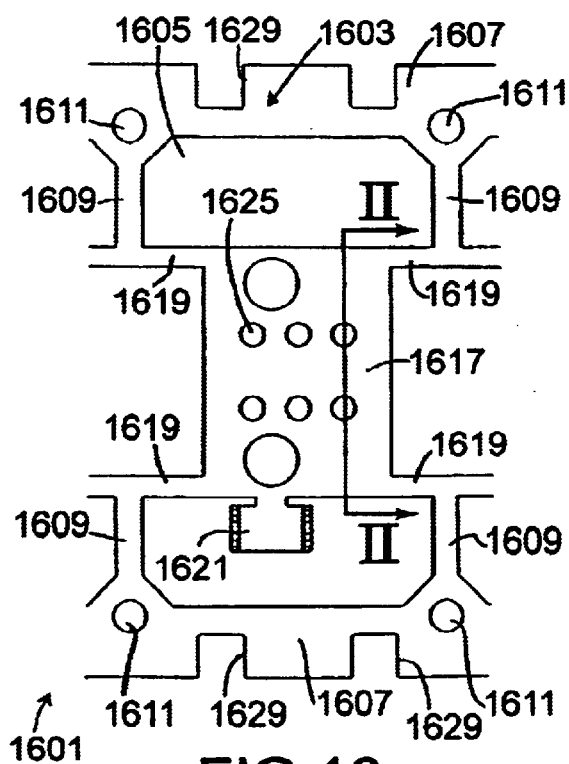
FIG.15
FIG.17
FIG.14
FIG.16

METHOD AND SYSTEM FOR MANUFACTURING ELECTRONIC PACKAGING UNITS

CROSS-REFERENCE TO RELATED APPLICATIONS

This application is a continuation-in-part of the U.S. application Ser. No. 09/559,545, filed Apr. 28, 2000, now U.S. Pat. No. 6,220,915, which is a divisional application of U.S. application Ser. No. 09/172,760, filled Oct. 15, 1998, now U.S. Pat. No. 6,087,195.

FIELD OF THE INVENTION

This invention relates to an automated manufacturing of lamp tiles and electronic packaging units, more specifically, to manufacturing lamp tiles and electronic packaging units from a plurality of lead frame reels in an assembly line process.

BACKGROUND OF THE INVENTION

Small light lamps such as light emitting diodes (LEDs) have been widely used as indicators or components of displays because of their high mechanical stability, low operating voltage, and long service life. When a plurality of the small light lamps are arranged in a two dimensional array and inserted into an electrically wired board configured to control each lamp, the resulting structure forms a large display board. In one prior system, such large display boards have been employed as score boards in sports arenas.

Manufacturing of display boards requires wiring of internal electrical circuit for controlling each lamp and wiring sockets for receiving each lamp. The lamps also must be individually inserted into the sockets. The preceding requirements, among others, make the manufacturing of display boards to be cumbersome and not readily adaptable to an automated assembly line processing. In turn, the display boards are ordinarily custom designed with high manufacturing costs.

Electronic packages are widely used to electrically connect electronic devices, such as semiconductor integrated circuits or microchips to bonding fingers of conductive leads to form the input/output leads for the package. It has become increasingly challenging to fabricate lead frames having closely spaced bonding fingers. As the number of input/output leads increases and as chip sizes shrink, the spacing between the leads decreases so that it is difficult to fabricate lead frames even using chemical etching techniques. The leads also must be located at specified distances from the electronic device and the spacing between the bonding fingers themselves is limited to the thickness of the lead frame material itself. The preceding requirements, among others, make the manufacturing of electronic packaging units to be cumbersome.

SUMMARY OF THE INVENTION

The present invention is directed to a method, system and apparatus for manufacturing electronic packaging units. These electronic packaging units are typically housings which are configured to receive electronic devices, such as microchips, semiconductors or light emitting diodes (LEDs). The electronic device is electrically connected to leads for supplying power or receiving electric signals.

Specifically, the present invention relates to a method for fabricating at least one electronic packaging unit having a molded body and a plurality of electrically conductive leads protruding therefrom, by providing a first lead frame segment defining a first aperture and including at least one first lead extending into the first lead frame aperture; providing a second lead frame segment defining a second aperture and including at least one second lead extending into the second lead frame aperture; overlaying the first and second lead frame segments above the other and positioning the first and second leads spaced apart from each other by a predetermined distance in a side view of the overlaid lead frame segments; and depositing molding material in a predetermined pattern on the first and second leads, thereby forming the molded body wherein a portion of the first lead and a portion of the second lead each protrude from the deposited molding material.

This method includes the steps of forming an opening over at least one lead for receiving an electronic device and trimming the first and second leads from the first and second lead frame segments. The step of overlaying the first and second leads includes the step of setting the predetermined distance to be between 0.01 and 0.03 inches, and preferably, between 0.01 and 0.015 inches.

Preferably, the first frames segment are produced by the step of stamping the first lead frame segments on a first elongated sheet made of electrically conductive rigid material, and the second frame segments are made by the step of stamping the second lead frame segments on a second elongated sheet made of electrically conductive rigid material.

The invention also relates to a system for fabricating a plurality of electronic packaging units, comprising a plurality of first lead frame segments which define first apertures and include a plurality of first leads extending into the first lead frame apertures; a plurality of second lead frame segments which define second apertures and including a plurality of second leads extending into the second lead frame apertures; a plurality of pins configured to overlay one of the first and second lead frame segments; a feeder for receiving the plurality of first and second lead frame segments and for overlaying the plurality of pins on one of the first and second lead frame segments such that a portion of each of corresponding said first and second leads are spaced apart from each other by a predetermined distance in a side view of the overlaid lead frame segments; and a molder configured to deposit molding material in a predetermined pattern such that a portion of each corresponding the first lead protrudes from the deposited molding material, and a portion of each corresponding the second lead protrudes from the deposited molding material.

The system preferably includes a trimmer configured to cut the first and second leads from the first and second lead frame segments, a first stamping device configured to stamp the first and second lead frame segments on first and second elongated sheets made of electrically conductive rigid material.

The present invention is also directed to an electronic packaging unit including a molded body formed from a mold material, a first lead including a first portion with the mold material deposited thereupon and extending within the molded body and a second portion that protrudes from the molded body; and a second lead spaced from the first lead, including a first portion with the mold material deposited thereupon and extending within the molded body and a second portion that protrudes from the molded body.

The packaging unit preferably has first and second leads that lie substantially in first and second planes and the first and second planes are parallel with respect to each other.

One of the first and second leads can be disposed along a portion of a bottom of the molded body. The molded body preferably has a cavity and the cavity is configured to receive an electronic device. Preferably, a terrace is provided adjacent the cavity and at least one of the first and second leads is exposed along the terrace. The molded body can include a second terrace adjacent the cavity with one of the first and second leads is exposed along the second terrace.

The packaging unit preferably includes a first or second lead with a hole for receiving the mold material. The packaging unit can also include a third lead including a first portion with the mold material deposited thereupon and extending within the molded body and a second portion that protrudes from the molded body, and the first, second, and third leads are spaced from one another. Preferably, the first, second, and third leads are substantially planar and are disposed parallel with respect to each other.

The present invention is also directed to a method and apparatus for manufacturing lamp tiles. A lamp tile is a panel which has a plurality of light openings into which small light lamps are inserted and which includes a plurality of anode and cathode leads electrically connected to anode and cathode ends of corresponding small lamps for supplying or cutting off electrical power to the lamps. The lamp tiles are mounted into a display board configured to receive the anode and cathode leads of the lamp tiles. Such a display board also includes control circuit to control the on/off states of each lamp tile.

BRIEF DESCRIPTION OF THE DRAWINGS

FIG. 8 is a plan view of a portion of a lead frame of one embodiment of a packaging unit, which includes two lead frame segments;

FIG. 9 is a plan view a portion of a heat sink lead frame, which includes two lead frame segments;

FIG. 10 is a cross-sectional view of heat sink lead frame of FIG. 9 taken along line I—I;

FIG. 11 is a plan view of a segment of the lead frame of FIG. 8 overlaid on top of a segment of the lead frame of FIG. 9;

FIG. 14 is a plan view of a portion of a lead frame of another embodiment of a packaging unit, which includes one lead frame segment;

FIG. 15 is a perspective view of the lead frame of FIG. 14;

FIG. 16 is a plan view a portion of a heat sink lead frame, which includes one lead frame segment;

FIG. 17 is a perspective view of the lead frame of FIG. 16;

DETAILED DESCRIPTION OF THE PREFERRED EMBODIMENTS

Figure 1:
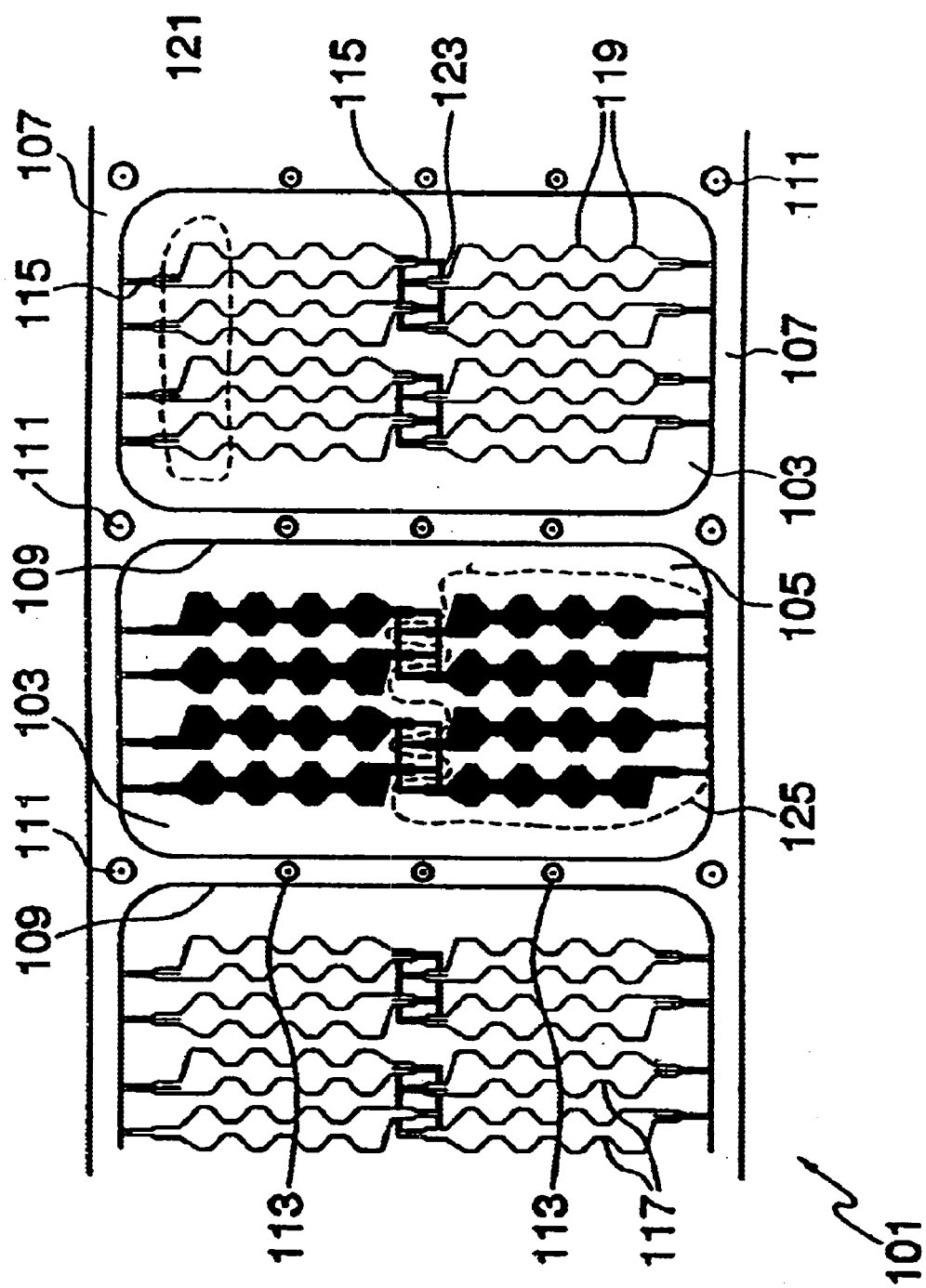
FIG. 1 is a plan view of a portion of a cathode lead frame, which includes three lead frame segments of the cathode lead frame.

Referring to FIG. 1, a cathode lead frame 101 includes a plurality of lead frame segments 103. Each lead frame segment 103, in turn, has a cathode lead aperture 105 delineated by side portions which include a pair of side rails 107 and crossbars 109. The pair of spaced apart side rails 107 are connected to and supported by the crossbars 109. Cathode feeder holes 111, regularly spaced, are formed in the side rails 107, and cathode lead alignment holes 113 are formed in the crossbars 109. Each cathode lead frame segment 103 also includes a plurality of cathode leads 117 attached to the side portions and extending into the cathode lead aperture 105. Blackened portions in FIG. 1 illustrate two sets of cathode leads 125.

The cathode lead frame 101 is generally of copper. Any electrically conductive rigid material, however, is adequate for making the cathode lead frame 101. The rigid material is formed into an elongated sheet which is, typically nickel plated. The thickness of the elongated sheet is about 0.005 to 0.02 inches and, preferably, 0.010 to 0.015 inches. The nickel plated sheet, in turn, is preferably gold plated. In other embodiments, the rigid material can be plated with a base metal of other than nickel and then subsequently plated with an electrically conductive precious metal such as palladium, silver or the like.

The cathode lead frame segments 103 are formed in the elongated sheet, preferably by a stamping process and, alternatively, by an etching process, both of which are known processes in the art. The elongated sheet has a sufficiently length to form at least a thousand lead frame segments and, preferably, more than five thousand lead segments.

In one aspect of the preferred embodiment, the cathode lead frame aperture 105 has a substantially rectangular shape. In alternative embodiments, the cathode lead frame aperture 105 is a square, circle or any shape that allows formation of a plurality of cathode leads.

In another aspect of the preferred embodiment, each cathode lead 117 has two lead ends 115. One of the lead ends 115 is attached to the side rails 107 and the other is attached to respective connecting members 123. The connecting members 123 are provided to render support between the two different sets of cathode leads 125 which eventually become parts of two lamp tiles. In other words, two lamp tiles are formed from each cathode lead frame segment 103. In other embodiments, various numbers of sets of cathode leads are provided, such as four sets in a two by two array, six sets in a three by two array, or eight in a four by two array. In these embodiments, however, the number of sets of cathode leads provided in a cathode lead frame segment is limited since stringing too many of them together by connecting members would not maintain structural integrity of the cathode lead frame.

In yet another aspect of the preferred embodiment, each set of cathode leads 125 includes four cathode leads 117, each cathode lead 117 including four bubble shaped nodes 119 arranged to form four arrays of neighboring nodes 121. Each node 119 comes in contact with a cathode end of a lamp, as will be discussed later. The bubble shape is provided for good electrical contact between it and the cathode end of a lamp. In alternative embodiment, nodes with different shapes are provided and the only requirement on the shape of the nodes is that they provide good contacts to respective cathode ends of lamps. In one alternative embodiment, a small depression or bump is formed in each of the nodes in order to achieve a good contact with a cathode end.

In other alternative embodiments, different number of cathode leads 117 are provided for each set of cathode leads 125, and different number of nodes 119 are provided for each cathode leads 117. In one exemplary embodiment, six cathode leads for each set of cathode leads and six nodes for each cathode lead are provided. In another exemplary embodiment, four cathode leads for each set of cathode leads and six nodes for each cathode lead are provided. As the preceding exemplary embodiments illustrate, the number of cathode leads in a set of cathode leads and the number of nodes for each cathode lead are not limited to a four by four array as shown in FIG. 1.

Figure 2:
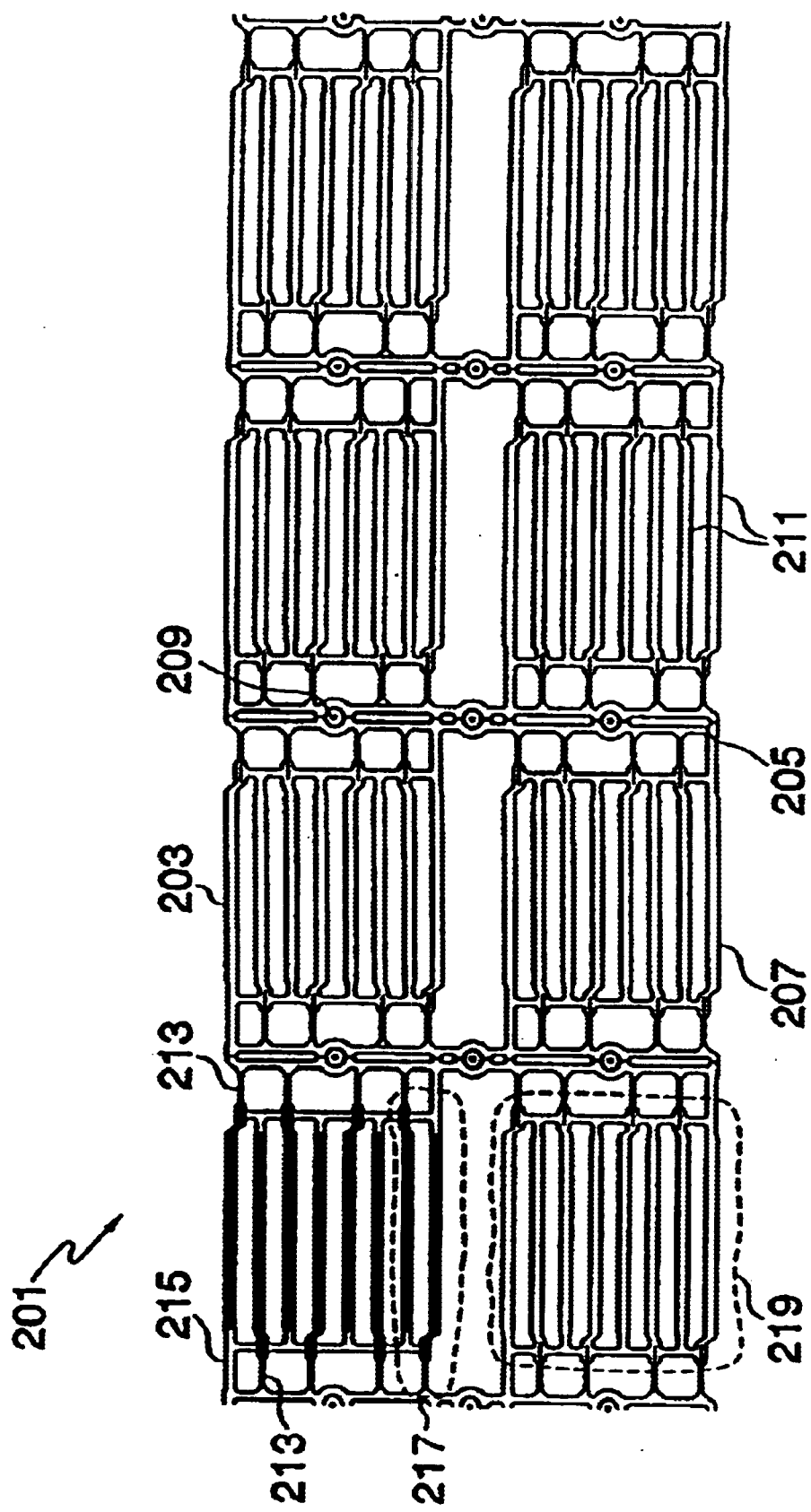
FIG. 2 is a plan view of a portion of an anode lead frame, which includes four lead frame segments of the anode lead frame.

Now referring to FIG. 2, an anode lead frame 201 includes a plurality of anode lead frame segments 203. Each anode lead frame segment 203 includes anode crosspieces 205, which delineates individual lead frame aperture 207. Each anode crosspiece 205 includes anode alignment holes 209. In addition, each anode lead frame segment 203 includes a plurality of anode leads 211. Each anode lead 211 in turn has two anode lead ends 213 one of which is connected to the anode crosspieces 205 and the other one of which is connected to connecting members 215. Two neighboring anode leads form a pair of anode leads 217. Each set of anode leads 219 includes four pairs of anode leads 217 corresponding to the four arrays of neighboring nodes 121 of each set of cathode leads 125 in FIG. 1.

In one aspect of the preferred embodiment, the anode lead frame is made from substantially the same material and by substantially the same process as that of the cathode lead frame 101. In an alternative embodiment, the anode lead frame may be made from a different electrically conductive rigid material or by a different process than that of the cathode lead. In addition, other alternative embodiments in connection with the number of anode lead frames, the shape of anode aperture, the number of sets of anode leads per anode lead frame segment, the number of pairs of anode leads per anode set of anode leads, and the shape of anode leads have similar options available to them as that of cathode lead frame 101 and its corresponding parts.

In another aspect of the preferred embodiment, no side rail similar to the cathode side rails 107 is provided to the anode lead frame. In alternative embodiments, side rails are provided to enhance the structural integrity of the anode lead frame 201.

Figure 4:
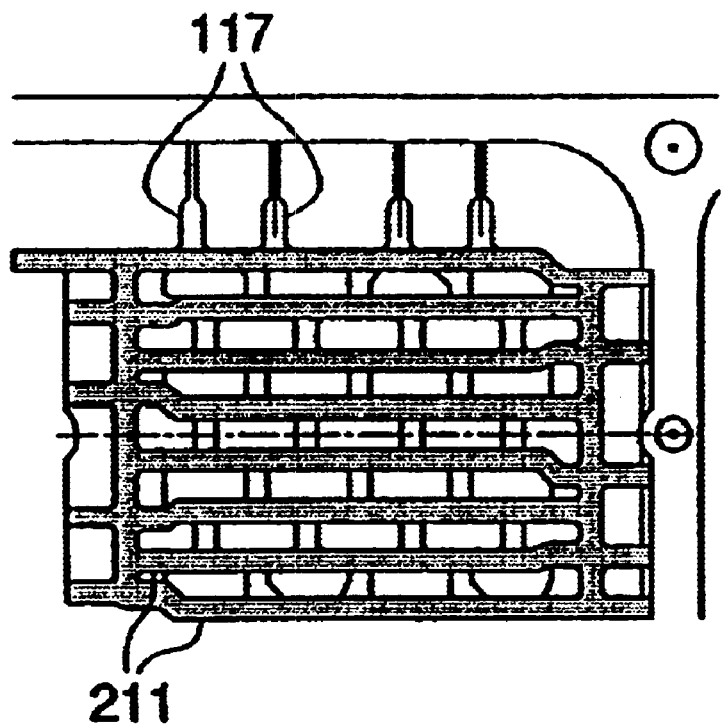
FIG. 4 is a plan view of one set of anode leads overlaid on top of one set of cathode leads.

Referring to FIG. 4, in a plan view, when the anode alignment holes 209 are co-located with the alignment holes 113 in the cathode lead frame 101, each pair of anode leads 217 intersect with corresponding array of nodes 121 of the cathode lead frame 101. This arrangement allows individualized control of lamps in contact with each node of the cathode leads and anode leads as discussed herein.

The intersections between the cathode and anode leads 117, 211 form a two dimensional array. More specifically, the anode and cathodes leads 117, 211 perpendicularly intersect with each other. In alternative embodiments, the anode and cathode leads can intersect each other at an angle of other than 90 degrees. Although no particular criticality is required for this angle, it preferably ranges from about 30 to 60 degrees. In these alternative embodiments, the cathode leads or anode leads extend at an angle into the cathode lead frame aperture and the anode lead frame aperture, respectively. These alternative embodiments are possible as long as individual control of the light lamps can be performed as discussed herein.

Figure 3:
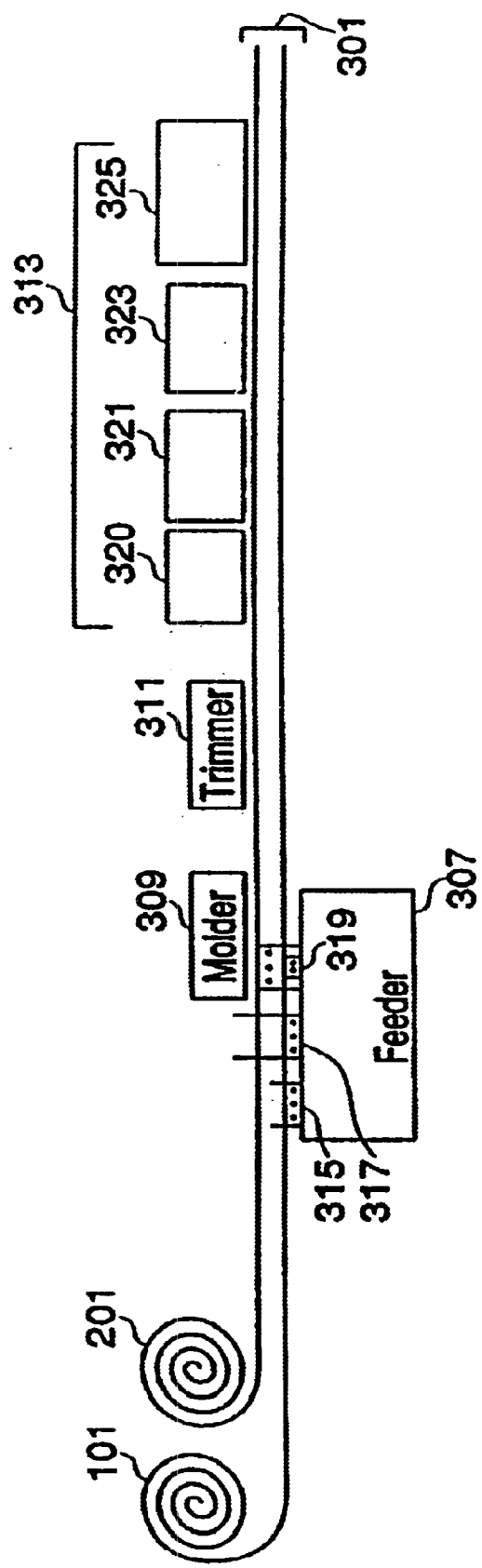
FIG. 3 is an overview of an automated assembly line for manufacturing lamp tiles.

Now referring FIG. 3, a manufacturing assembly line 301 includes an anode lead frame 201, a cathode lead frame 101, a feeder 307, a molder 309, a trimmer 311 and a post processor 313. The feeder 307 has a plurality of cathode feed pins 315, a plurality of alignment pins 317 and a plurality of precision positioning pins 319. In an alternative embodiment, two stamping devices may be provided for stamping cathode and anode lead frames in two elongated sheets of metal.

The anode lead frame 201 is rolled up into a anode reel, and the cathode lead frame 101 is rolled up into a cathode reel. The anode and cathode reels are unrolled to feed their respective lead frames into the feeder 307.

The cathode feeder pins 315, configured to fit into the feeder holes 111 in the cathode lead frame 101, are inserted into the feeder holes 111. Subsequently, the alignment pins 317, configured to fit into the alignment holes 113 in the cathode lead frame 101 and fit into the anode alignment holes 209 in the anode lead frame 201, are inserted into the alignment holes 113, 209. Once the alignment pins are fitted into the alignment holes 113, 209, the cathode lead frame 101 and anode lead frame 201 are overlaid and aligned. The combination of the cathode feeder pins 315 and the alignment pins 317 move the cathode and anode reels 101, 201 along the assembly line 301.

In alternative embodiments, the cathode lead frame holes and the cathode alignment holes and the anode alignment holes are omitted. In these embodiments, the cathode feeder pins 315 and the alignment pins 317 are used to feed and align the cathode and anode lead frames 101, 201 by using side rails 107, crossbars 109 and crosspieces 205.

Figure 5:
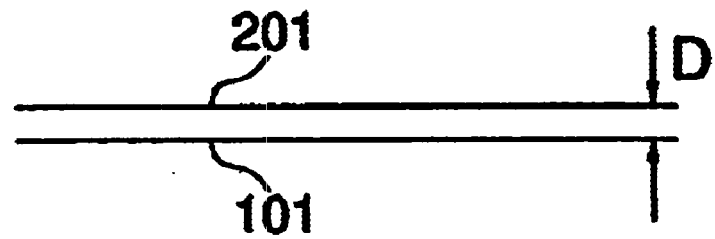
FIG. 5 is a side view of an anode lead frame overlaid on top of a cathode lead frame.

The precision positioning pins 319 place the anode lead frame 201 apart from the cathode reel 101 by a distance on the range of about 0.01 to 0.03 inches, and, preferably, on the range of 0.01 to 0.015 inches. The distance is designated as D in FIG. 5. In any event, the minimum distance is electrical conductivity between the anode and cathode leads, and the maximum distance is controlled by the lamp design. For example, if the distance between the anode and cathode leads is too large than the cathode and anodes of lamps may not be connected to the cathode and anode leads efficiently.

The distance between the cathode lead frame 101 and the anode lead frame 201 is maintained when they are fed into the molder 309. The molder 309 then deposits molding material onto the respective lead frame portions of the cathode reel 101 and anode reel 201 in a predefined pattern. The molding material is a high temperature nylon and is, preferably, AMODEL® resin, a product manufactured by Amoco. AMODEL® resin is a high temperature nylon which can withstand up to 570° F. without being deformed. The invention is operable with any one of a number of other engineering plastics or similar materials which can be molded and provide high temperature tolerance.

In one aspect of the preferred embodiment, the molding material is deposited between the anode and cathode leads where they intersect with other. In an alternative embodiment, some potting material such as epoxy material is deposited between the anode and cathode leads where they are at the intersections. This alternative embodiment enhances the bonding between the anode and cathode leads and, depending on the material used, may reduce the occurrences of shorting between the anode and cathode leads.

Figure 6:
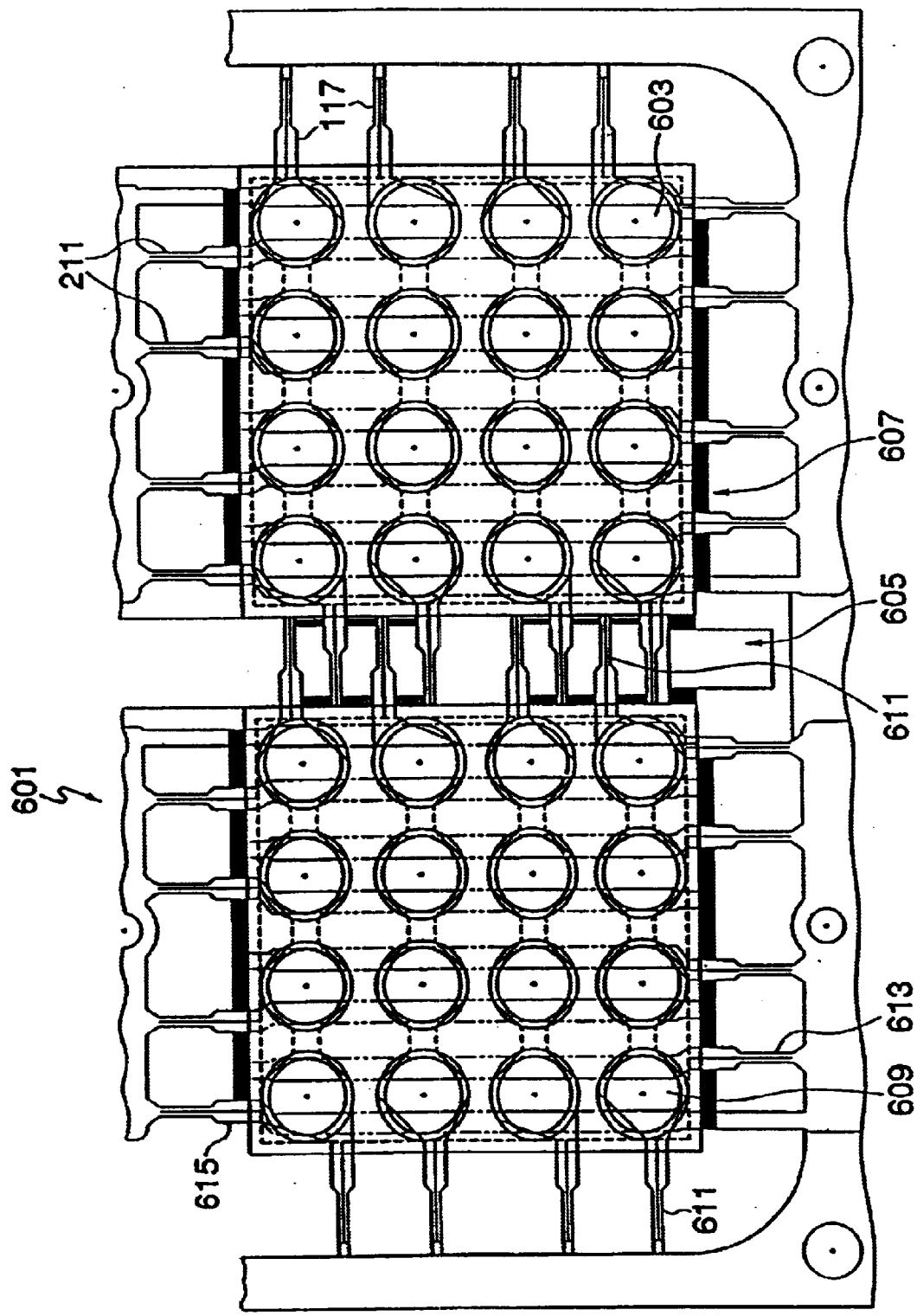
FIG. 6 is a plan view of molded lamp tiles.

Referring to FIG. 6, in the molder 309 each lamp tile 601 is formed within the predefined pattern. The predefined pattern includes a set of dam-bars 607 and gate trims 605 and a set of cylindrically shaped cores (not shown) placed where light openings 603, also referred as light pipes, are to be formed. The light openings 603 are disposed in the functioning side, as shown in FIG. 6. In alternative embodiments, a set of conically or parabolically shaped cores or a set of rectangular, circular or other shaped dam-bars are provided. For instance, when the parabolically shaped cores are utilized, the light openings 603 are molded into parabolic shapes that produce consistent light beams.

In one aspect of the preferred embodiment, the lamp tile has a flat panel shape. In alternative embodiment, the functioning side of lamp tile 601 may be concave, convex or sloped in one direction in order to accommodate different display board designs.

Figure 7:
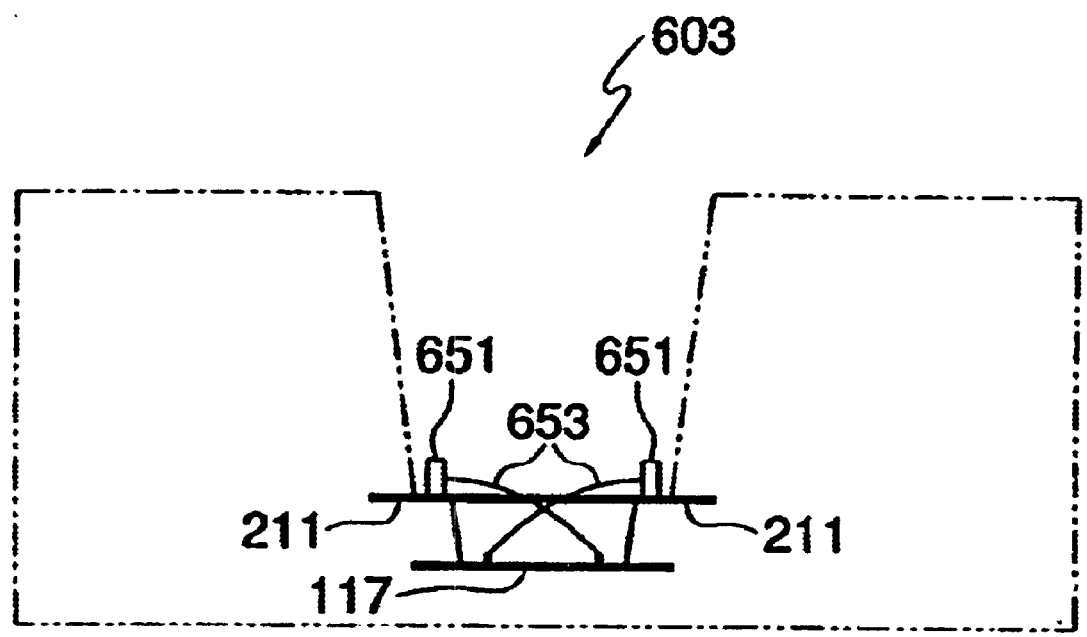
FIG. 7 is a cross-sectional view of a light opening.

Referring to FIG. 7, a light opening 603 exposes portions of a pair of anode leads 211 and a corresponding node 117 of the cathode leads 119. When light lamps 651 are disposed in the light openings 603, the cathode end of each lamp 651 makes a contact with a corresponding exposed portion of the cathode node 117, and the anode end of each lamp makes a contact with corresponding exposed portion of anode lead 211.

The contacts between ends of a light lamp and exposed portions of the leads are, preferably, established by a wire bonding process. In the wire bonding process, thin wires 653 are provided to establish the electrical connections. Subsequently, the light opening is, preferably, filled with clear epoxy material and, alternatively, is not filled with any material.

The anode and cathode leads function as switches for the inserted light lamps. In other words, one combination of an anode and a cathode function as one switch and the other combination functions as a second switch.

In one of the preferred embodiments, the inserted light lamps are capable of displaying three different colors: green, red and white. This is achieved by providing two different colored lamps, green and red, into each of the light openings. The on/off states of each the lamp is controlled by the pair of anodes and cathodes switches. More specifically, one anode and cathode combination controls the on/off states of green colored lamp and the other combination controls the on/off states of red colored lamp. Furthermore, when both of them are in the on state, then the resulting light beam is the white color.

In an alternative embodiment, single color light lamps are utilized. In this embodiment, its anode leads do not need to be paired up as described by referencing FIGS. 1 and 2, since only one combination of an anode and cathode leads are required. Furthermore, when the size and shape of light lamps change, the size and shape of the nodes of cathode leads and light openings change as well to accommodate different light lamps.

In the embodiment depicted in FIG. 6, each lamp tile is provided with sixteen sets of switches, each set with two switches. Each switch is controlled by supplying electrical power to or cutting off the electrical power from corresponding lead ends extending beyond the molding material of the corresponding lamp tile. For instance, a light opening 609 exposes a portion of a node of cathode lead 611 which has two ends extending outside of the molded body and a portion of a pair of anode leads 613 and 615 each of which has one end. Therefore, in the preceding configuration, a lamp inserted into the light opening 609, its anode and cathode ends electrically connected to the corresponding anode leads 613, 615 and cathode lead 611, is controlled by supplying electrical power to or cutting off the power to respective lead ends. In the similar manner, all of the inserted light lamps are switched on or off.

In other alternative embodiments, the resulting light opening array can be different from a four by four array since a simple change in the structure of the lead frames can allow the resulting tile to have any size array—including a non square array as described above in reference with FIG. 1.

Referring back to FIG. 3, the trimmer cuts individual lamp tiles from the respective tiles by trimming the connecting members 123 and 215 from respective leads connected to them.

In one aspect of the preferred embodiment, both ends of each cathode and anode leads protrude from respective lamp tiles. In other words, each cathode lead starts from one side of the lamp tile, extends across the lamp tile, and protrude from the other side of the lamp tile. Each anode lead also starts and ends on opposite sides of the respective lamp tile. In alternative embodiment, not all of the anode and cathode leads extend the length of the respective lamp tiles.

In another aspect of the preferred embodiment, when the trimmer 311 cuts the connecting members 123 and 215, each cathode lead has two ends, whereas each anode lead has only one end. In alternative embodiments, two ends are provided for each anode lead or only one end provided for each cathode lead. In any event, the ends of leads which protrude from the lamp tiles are bent downward to be inserted into a display board.

The novel design of the cathode and anode lead frames 101 and 201 of this invention allows the above described assembly line processing to be achieved. This assembly line processing further allows the subsequent post processing to take place. Hence, in the preferred embodiment the trimmed lamp tiles remain in the reels for further processing. In another embodiment, however, the trimmed lamp tiles are separated from the reels and stored for further processing.

Subsequent to the trimmer, the post processor performs a number of packaging functions on the lamp tiles. The packaging functions include a combination of inserting light lamps into the light openings 320, wire bonding 321, inserting clear epoxy into the light openings 323. The wire bonding process employs thin wires, preferably made from aluminum, to connect the exposed portions of the anode and cathode leads to respective anode and cathode ends of inserted lamps. The testing process 325 tests the integrity of lamp tiles such as non-conductivity between the anode and cathode leads and on/off states of the inserted light lamps.

After the post processing, the lamp tiles are ready to be mounted into a display board that is adapted to receive the lamp tiles and wired to control the lamp tiles and respective lamps.

The above described method and system is also applicable to forming semiconductor or electronic device packages. Referring now to FIGS. 8–13, a preferred embodiment of a semiconductor package is shown. A lead frame 801 includes a plurality of lead frame segments 803. Each lead frame segment 803, in turn, has a lead aperture 805 delineated by side portions which include a pair of side rails 807 and crossbars 809. The pair of spaced apart side rails 807 are connected to and supported by the crossbars 809. Feeder holes 811, regularly spaced, are formed in the side rails 807. Each lead frame segment 803 also includes a pair of leads 817 attached to the side portions and extending into the lead aperture 805. Preferably, leads 817 are integral with crossbars 809 and spaced from side rails 807. Leads 817 are generally rectangular with a square portion 819 and a flared portion 821 on opposite ends. Square portion 819 extends outwardly from lead aperture 805 and flared portion 821 extends inwardly into lead aperture 805.

Lead frame 801 is preferably made from substantially the same material as cathode lead frame 101. Lead fame segments 803 are formed in the elongated sheet by substantially the same process as described for cathode lead frame segments 103. However, as described previously with regard to cathode lead frame 101, any electrically conductive rigid material is adequate for making the lead frame. The rigid material is formed into an elongated sheet which is, then, nickel plated. The thickness of the elongated sheet is on the range of about 0.005 to about 0.020 inches and, preferably, about 0.010 to about 0.015 inches. The nickel plated sheet, in turn, is:preferably gold plated. In other embodiments, the nickel plated sheet is plated with palladium, silver or any electrically conductive precious metal.

Now referring to FIG. 9, a substantially planar heat sink lead frame 901 includes a plurality of heat sink lead frame segments 903. Each heat sink lead frame segment includes an aperture 905 delineated by a pair of side rails 907 and crosspieces 909. The pair of spaced apart side rails 907 are connected to and supported by the crosspieces 909. Feeder holes 911 are formed in the side rails 907 and are regularly spaced therealong. Each heat sink lead frame segment 903 also includes a heat sink lead 917 attached to and extending between the crosspieces 909 across the lead aperture 905. Heat sink lead 917 is generally rectangular with a pair of notches 919 along its side and angled corners 921 extending outwardly from crossbars 909. Notches 919 are spaced centrally between crossbars 909.

Notches 919 and corner portions 921 preferably include a raised step portion 923. Preferably, a plurality of holes 925 extend through lead 917 adjacent corner portions 921. As will be discussed in detail below, during molding, mold material preferably flows around step portions 923 and through holes 925 to substantially fill the vacant space. When the mold material solidifies, the material remaining around step portions 923 and in holes 925 functions to securely fix or rivet heat sink lead frame 901 to the molded body. Also, flared portions 821 function to secure lead frame 801 to the molded body prevent leads 817 from moving outwardly with respect thereto.

In one aspect of the preferred embodiment of the semiconductor package, the heat sink lead frame 901 can be made from the same material as lead frame 801 and lead fame segments 903 are formed in the elongated sheet by the same process as described for lead frame segments 803. In an alternative embodiment, the lead frame 801 is made from different electrically conductive rigid material or made by a different process than that of the heat sink lead frame 901.

Referring to FIG. 11, in a plan view, when the heat sink lead frame feeder holes 911 are co-located with the feeder holes 811, lead frame 801 overlays heat sink lead frame 901. Leads 817 overlap an outer portion of heat sink lead 917. In alternative embodiments, lead 817 and heat sink lead 917 do not need to overlap and can be spaced from each other. For example, when lead frame 801 and heat sink lead frame 901 are spaced vertically, lead 817 and heat sink lead 917 are free from contact.

Referring again to FIG. 3, manufacturing assembly line 301 is used to feed lead frame 801 and heat sink lead frame 901 through the semiconductor package assembly process in substantially the same manner as that described above with regard to lead frames 101 and 201. Feed pins 315 of feeder 307 engage feeder holes 811 and 911 of lead frames 801 and 901, respectively, and feed the lead frames 801, 901 to the molder 309. Precision positioning pins 319 place the lead frame 801 apart from the heat sink reel 901 by a distance on the range of 0.010 to 0.030 inches, preferably on the range of 0.010 to 0.015 inches. The molder 309 deposits molding material, described above, onto the respective lead frame portions of the lead frame 801 and heat sink lead frame 901 in a predefined pattern.

Figure 12:
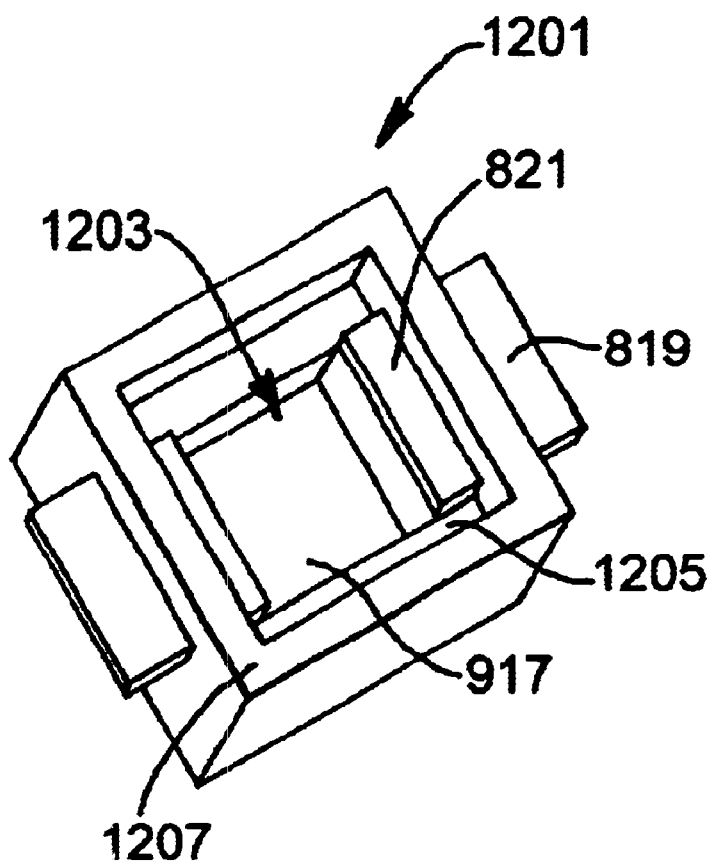
FIG. 12 is a perspective view of one embodiment of a packaging unit including the lead frames of FIGS. 8 and 9.
Figure 13:
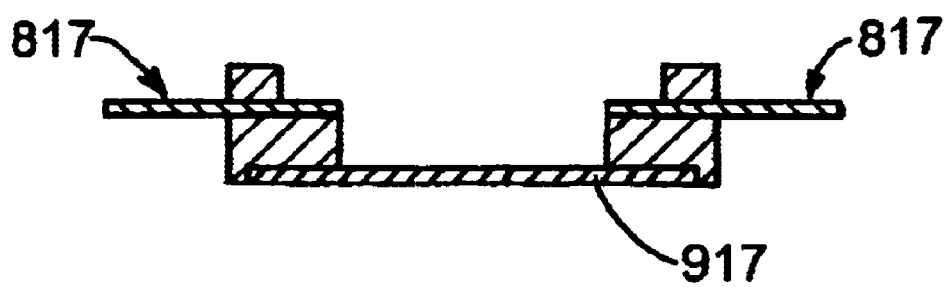
FIG. 13 is a side view of the package of FIG. 12.

Referring to FIGS. 12 and 13, in the molder 309, each semiconductor package is formed within the predetermined pattern. The predefined pattern includes a substantially rectangular molded package 1201 with a central cavity 1203. Heat sink lead 917 forms a portion of the bottom surface of the package 1201, however lead 917 may be located in any portion of package 1201 provided it is spaced from lead 817. An upper surface of heat sink lead 917 is exposed at the base of cavity 1203. A terrace 1205 is offset downwardly from the uppermost surface 1207 along the interior perimeter of cavity 1203. Leads 817 are spaced vertically from heat sink lead 917 and an upper surface of flared portions 821 are exposed along terrace 1205. Rectangular portions 819 extend outward laterally from the package.

Central cavity 1203 is configured and dimensioned to receive a microchip, semiconductor, or other electronic device. The electronic device may be attached to the upper surface of heat sink lead 917 such as by epoxy or other adhesive. Also, the electronic device may be electronically connected, such as by wire bond or other electrically conductive connection techniques, to the upper surface of leads 817 flared portions 821 to conduct electricity from the electronic device through leads 817. The electronic device can be electrically connected to the upper surface of heat sink lead 917 as well such that heat sink lead 917 functions as an electrical ground.

Referring to FIGS. 14–18, another embodiment of a semiconductor package is shown, As seen in FIGS. 14 and 15, lead frame 1401 includes a plurality of lead frame segments 1403. Each lead frame segment 1403 has a lead aperture 1405 delineated by side portions including a pair of side rails 1407 and crossbars 1409. Similar to previously described embodiments, feeder holes 1411 are regularly spaced in the side rails 1407. Each lead frame segment 1403 also includes a pair of leads 1417 and 1419 attached to the side portions and extending into the lead aperture 1405.

Lead 1417 has a plurality of arms 1421 extending from the side portions to two insulation displacement contact (IDC) units 1423 and a finger portion 1425. Lead 1419 includes two arms 1427 extending to an IDC unit 1429 and a finger portion 1431. Each IDC unit includes a pair of upwardly formed prongs 1433 with a central notch configured to receive insulated electrical wiring and displace the insulation surrounding the wire to create a sound electrical connection between prongs 1433 and the wire. In alternate embodiments, the geometrical configuration of the arms 1421, 1427, finger portions 1425, 1431 and IDC units 1423, 1429 in relation to the lead aperture 1405 can be varied.

Figure 19:
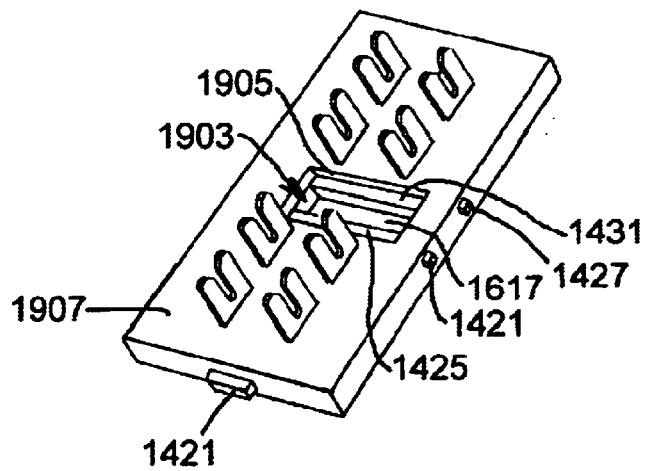
FIG. 19 is a perspective view of another embodiment of a packaging unit including the lead frames of FIGS. 14 and 16.

Now referring to FIGS. 16 and 17, a heat sink lead frame 1601 includes a plurality of heat sink lead frame segments 1603. Each heat sink lead frame segment includes an aperture 1605 delineated by a pair of side rails 1607 and crosspieces 1609. Feeder holes 1611 are formed in the side rails 1607 and are regularly spaced therealong. Each heat sink lead frame segment 1603 also includes a heat sink lead 1617 with side arms 1619 attached to and extending between the crosspieces 1609 across the lead aperture 1605. Heat sink lead 1617 is generally rectangular with IDC unit 1621 extending from one side. IDC unit 1621 is substantially similar to those described above, however, the prongs 1623 of IDC unit 1621 are preferably longer than prongs 1433. In this regard, when lead frames 1401 and 1601 are overlaid, prongs 1433 and 1623 extend the same distance beyond the molded body (FIG. 19).

Figure 16A:
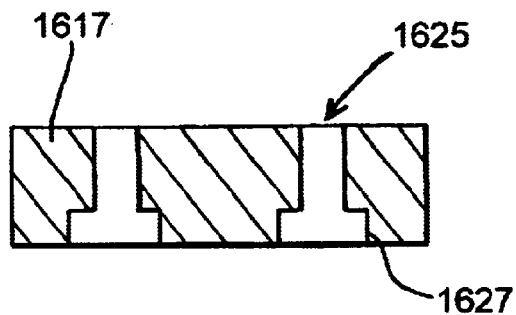
FIG. 16A is a cross-sectional view of the lead frame of FIG. 16 taken along line II—II

A plurality of holes 1625 extend through lead 1617. Referring to FIG. 16A, holes 1625 preferably include a countersink portion 1627 on the bottom surface of lead 1617. During molding, mold material preferably flows through holes 1625 and into countersink portion 1627 to substantially fill the vacant space. When the mold material solidifies, the material remaining in the holes 1625 and countersink portions 1627 form a solidified post-like structure that functions to rivet or securely fix heat sink lead frame 1601 to the molded body of the semiconductor package.

Figure 18:
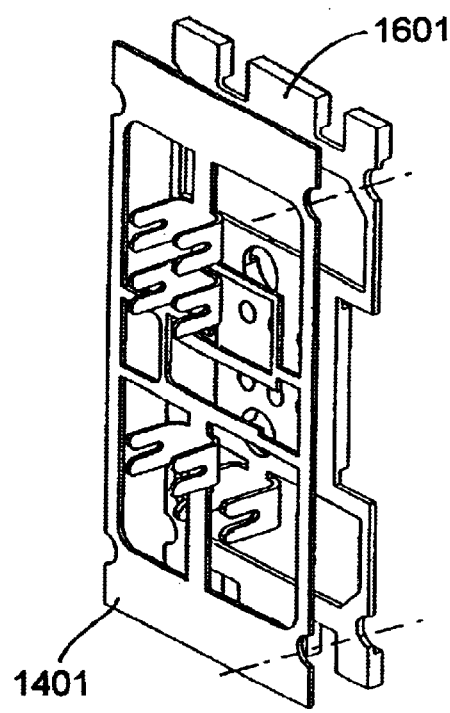
FIG. 18 is a perspective view of a segment of the lead frame of FIG. 14 overlaid on top of a segment of the lead frame of FIG. 16.

Referring to FIG. 18, in an exploded view, when the heat sink lead frame feeder holes 1611 are co-located with the feeder holes 1411, lead frame 1401 overlays heat sink lead frame 1601. Leads 1417, 1419 overlap a portion of heat sink lead 1617. In alternative embodiments, leads 1417, 1419 and heat sink lead 1617 do not need to overlap. When lead frame 1401 and heat sink lead frame 1601 are spaced vertically, leads 1417 and 1419 and heat sink lead 1617 are free from contact.

Lead frames 1401 and 1601 are preferably made from the same material and formed in substantially the same manner as described above for other embodiments. In one aspect of the preferred embodiment, heat sink lead frame 1601 is made from a material having a varied thickness. For example, as seen in FIG. 17, a portion of heat sink lead 1617 and rails 1607 preferably are about twice as thick as other portions of heat sink lead frame 1601. In this regard, lead frame 1601 is preferably made from dual gage stock and portions of the lead frame 1601 are milled to reach a desired thickness. In the preferred embodiment, notches 1629 are spaced along the outer edge of rails 1607 and facilitate the reeling or rolling of lead frame 1601 with a portion of rail 1607 being thicker than other portions of the lead frame.

Referring again to FIG. 3, manufacturing assembly line 301 is used as described previously to feed lead frame 1401 and heat sink lead frame 1601 through the assembly process. The lead frame 1401 is spaced apart from the heat sink lead frame 1601 by a distance on the range of about 0.010 to 0.030 inches, preferably on the range of 0.010 to 0.015 inches. The molder 309 deposits molding material onto the respective lead frame portions of the lead frame 1401 and heat sink lead frame 1601 in a predefined pattern.

Referring now to FIG. 19, in the molder 309, each package is formed within the predefined pattern. The predefined pattern includes a substantially rectangular molded package 1901 with a central cavity 1903. Heat sink lead 1617 forms a portion of the bottom surface of the package 1901. Lead 1617 may be located in any portion of package 1901 provided it is spaced from leads 1417 and 1419. An upper surface of heat sink lead 1617 is exposed at the base of cavity 1903. A terrace 1905 is offset downwardly from the uppermost surface 1907 along opposite sides of cavity 1903. Leads 1417 and 1419 are spaced vertically from heat sink lead 1617 and an upper surface of finger portions 1425, 1431 are exposed along terrace 1205. Arm portions 1421, 1427 extend outward laterally from the package.

Cavity 1903 is configured similar to cavity 1203, described above. An electronic device, such as a microchip, may be attached to the upper surface of heat sink lead 1617 and the electronic device may be electronically connected to the upper surface of leads 1417 and 1419 finger portions 1425 and 1431, respectively, to conduct electricity from the electronic device through leads 1417 and 1419.

Figure 20:
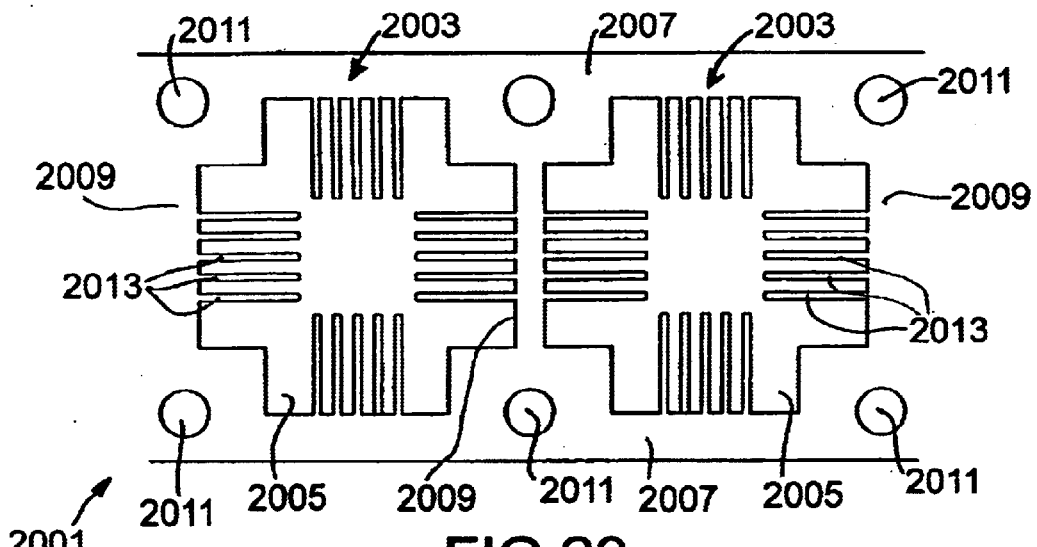
FIG. 20 is a plan view of a portion of a first lead frame of another embodiment of a packaging unit, which includes two lead frame segments.

Referring to FIGS. 20–23, another preferred embodiment of a semiconductor package is shown. As seen in FIG. 20, a first lead frame 2001 includes a plurality of lead frame segments 2003. Each lead frame segment 2003 has a lead aperture 2005 delineated by side portions including a pair of side rails 2007 and crossbars 2009. Similar to previously described embodiments, feeder holes 2011 are regularly spaced in the side rails 2007. Each lead frame segment 2003 also includes a plurality of leads 2013 attached to the side portions and extending into the lead aperture 2005.

Leads 2013 are generally rectangular shaped and resemble a plurality of fingers extending from the side portions toward the center of aperture 2005. In one aspect of the preferred embodiment, lead frame 2001 includes about 20 leads. Preferably, leads 2013 are evenly spaced along each side portion around aperture 2005 with groups of five leads along each side rail 2007 and cross bar 2009. In one aspect of the preferred embodiment, leads 2013 have a uniform width and are preferably spaced apart about 1.5 times the width of the leads. In other embodiments, leads 2013 can have varied widths, and the spacing between leads can be varied to accommodate more or less leads on the lead frame, as desired.

Figure 21:
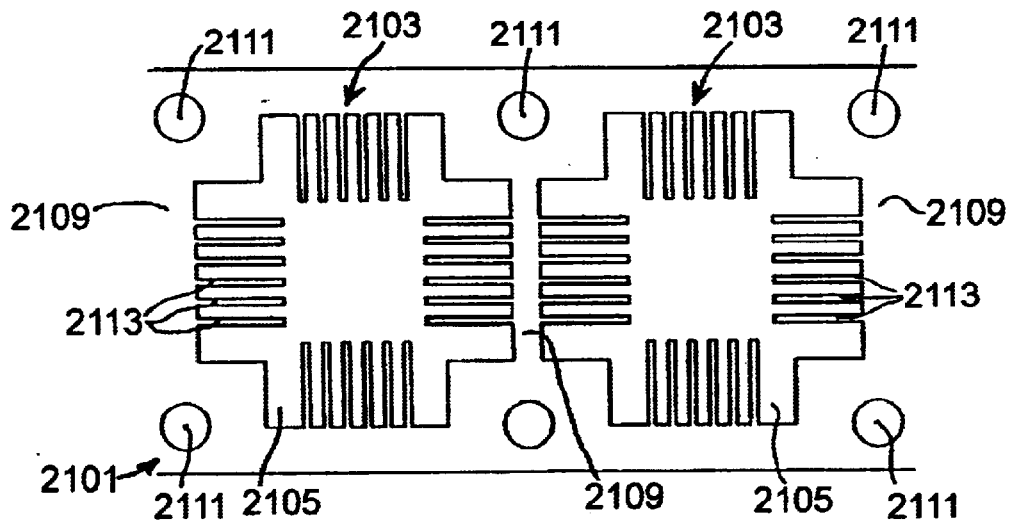
FIG. 21 is a plan view of a portion of a second lead frame, which includes two lead frame segments.

Referring to FIG. 21, a second lead frame 2101 includes a plurality of lead frame segments 2103 that are similar to first lead frame segments 2003, except for a few important differences. Lead frame segment 2103 includes a plurality of leads 2113 attached to the side portions and extending into the lead aperture 2005. Leads 2113 are shaped substantially the same as leads 2013 and preferably have the same width as leads 2013, however, leads 2113 are preferably shorter than leads 2013 and thus do not extend as far into aperture 2105 as leads 2013 extend into aperture 2005. Lead frame 2101 preferably includes a different number of leads 2103 than does lead frame 2001. In one aspect of the preferred embodiment, lead frame 2101 includes about 24 leads. Preferably, leads 2113 are evenly spaced along each side portion around aperture 2105 with groups of six leads along each side rail 2107 and cross bar 2109.

Figure 22:
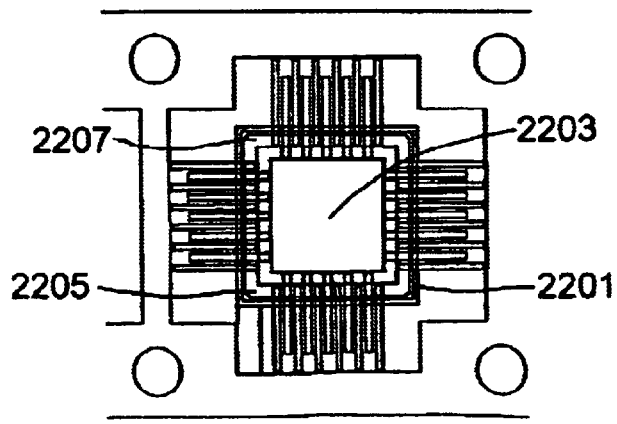
FIG. 22 is a plan view of a segment of the lead frame of FIG. 21 overlaid on top of a segment of the lead frame of FIG. 20 and a packaging unit.
Figure 23:
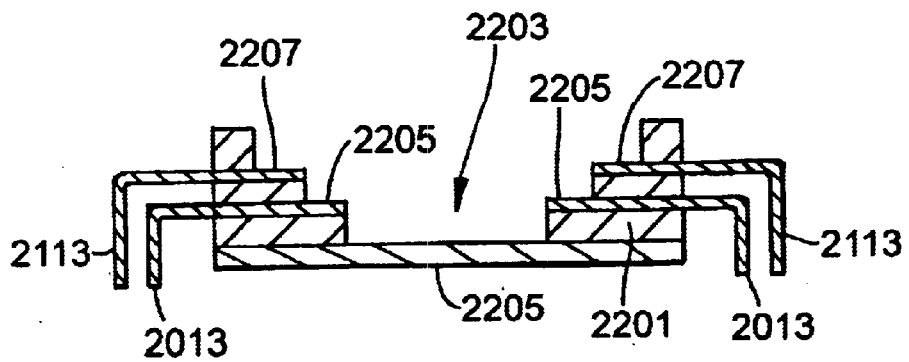
FIG. 23 is a cross-sectional view of the packaging unit of FIG. 22 taken along line III—III.

Referring to FIGS. 22 and 23, in a plan view, when the feeder holes 2011 of the lead frame 2001 are co-located with feeder holes 2111 of lead frame 2101. Leads 2113 are offset with respect to leads 2013. In this regard, leads 2113 are preferably disposed between leads 2013.

In one aspect of the preferred embodiment, a heat sink lead frame, such as heat sink frame 901 and 1601, described previously, may also be aligned with first and second frames 2001 and 2101 to form an aligned three lead frame configuration prior to molding. In alternative embodiments, heat sink leads may be loaded in the mold cavity independently. Such a configuration is maintained in the molder 309, as described above, and mold material is deposited onto lead frames 2001 and 2101 to form a generally rectangular body or package 2201.

Package 2201 includes a central cavity 2203 configured to receive an electronic device, as described above. Preferably, a heat sink 2205 forms a portion of the base of cavity 2203 and the electronic device is secured thereto, as described in other embodiments. Cavity 2203 includes two terraces extending around the perimeter of cavity 2203 offset downward from the topmost surface of package 2203. Lower terrace 2205 has a portion of leads 2013 of first lead frame 2001 exposed therealong and configured to be electrically coupled to the electronic device mounted in cavity 2203. Similarly, upper terrace 2207 has a portion of leads 2113 of second lead frame 2101 exposed therealong to be electrically coupled to the electronic device. Preferably, package 2203 is generally rectangular in a plan view and most preferably package 2203 is substantially square and the length of the sides of the square are about 5 mm. In other embodiments, the length of the sides of package 2201 can be less than 5 mm.

Figure 23A:
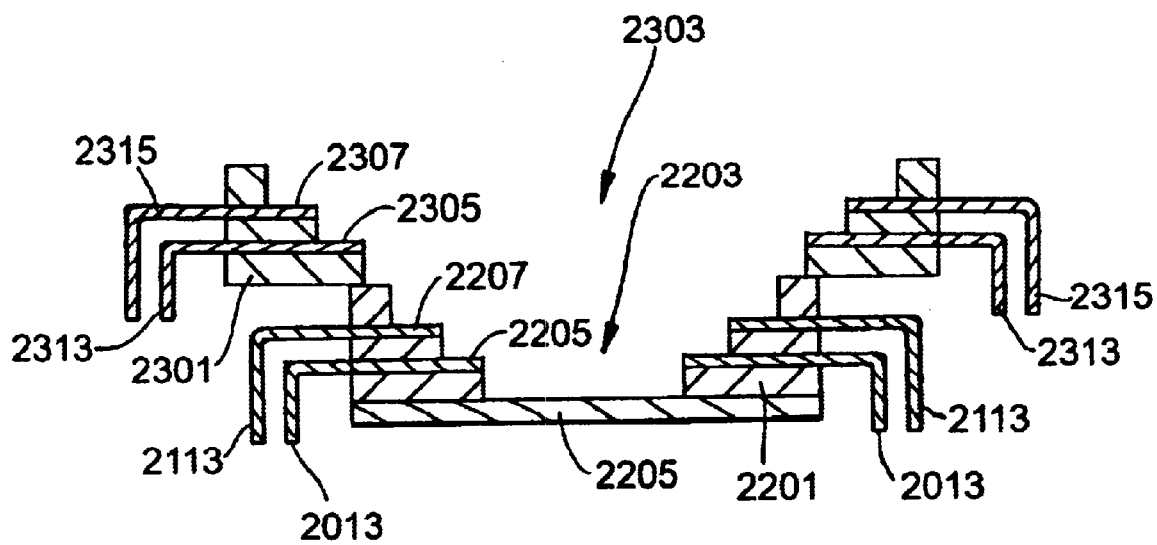

Referring to FIG. 23, in one aspect of the preferred embodiment, after package 2201 is molded, leads 2013, 2113 are trimmed and bent downward. In this way, leads 2013, 2113 may be readily mounted to a circuit board or incorporated into a larger circuit. Referring to FIG. 23A, in another aspect of this embodiment, a second molded body 2301 may be formed in substantially the same manner as described above with leads 2313 and 2315, a central cavity 2303 extending through the molded body 2301 having dimensions corresponding to the outside perimeter of package 2201, and two terraces 2305, 2307 extending around the perimeter of the cavity 2303 as described above. The molded body can then be attached to the topmost surface, of package 2203, such as by adhesive, ultrasonic bonding or other known attachment method. In this way, the combined molded bodies can form a package having a central cavity with four terraces along the interior of the central cavity similar to a tiered stadium. Numerous iterations and combinations of molded bodies are envisioned that can be formed using such a technique. In this way, the spacing surrounding an electronic device can be optimized to maximize the input/output connections from an electronic device while minimizing the overall space or volume consumed by the packaging unit.

Figure 24:
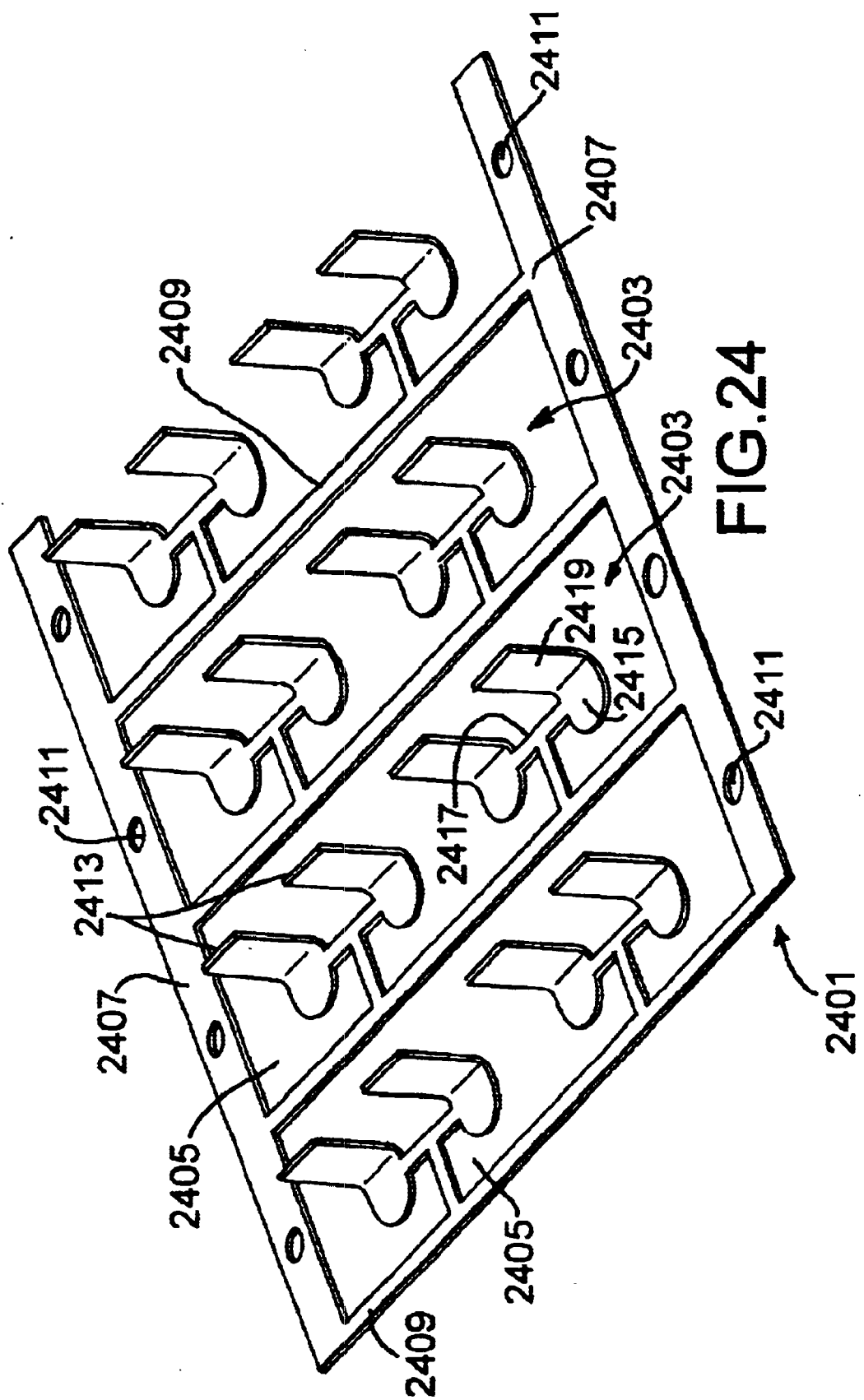
FIG. 24 is a perspective view of a portion of a first lead frame of another embodiment of a packaging unit, which includes four lead frame segments.
Figure 25:
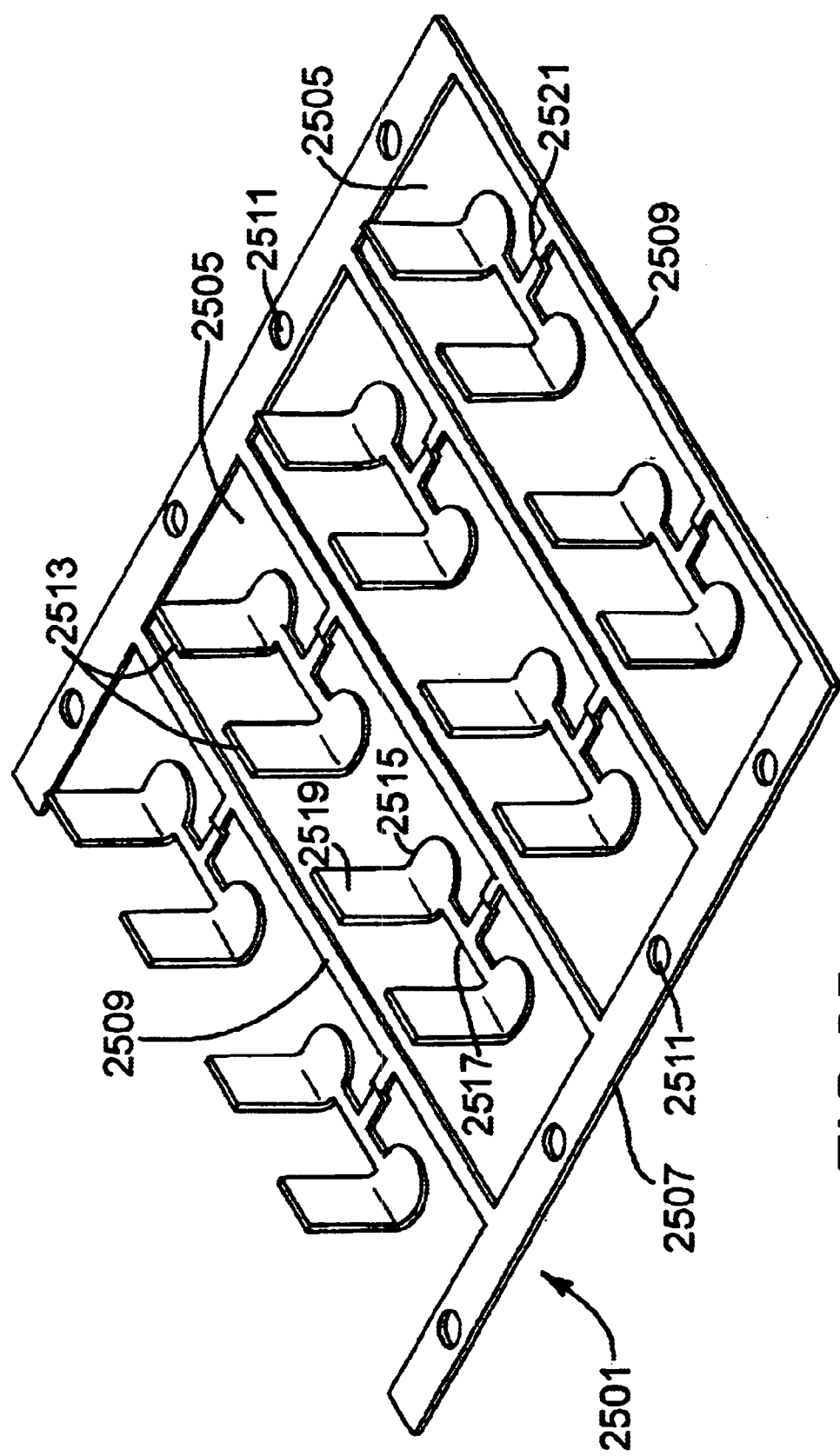
FIG. 25 is a perspective view of a portion of a second lead frame, which includes four lead frame segments.
Figure 26:
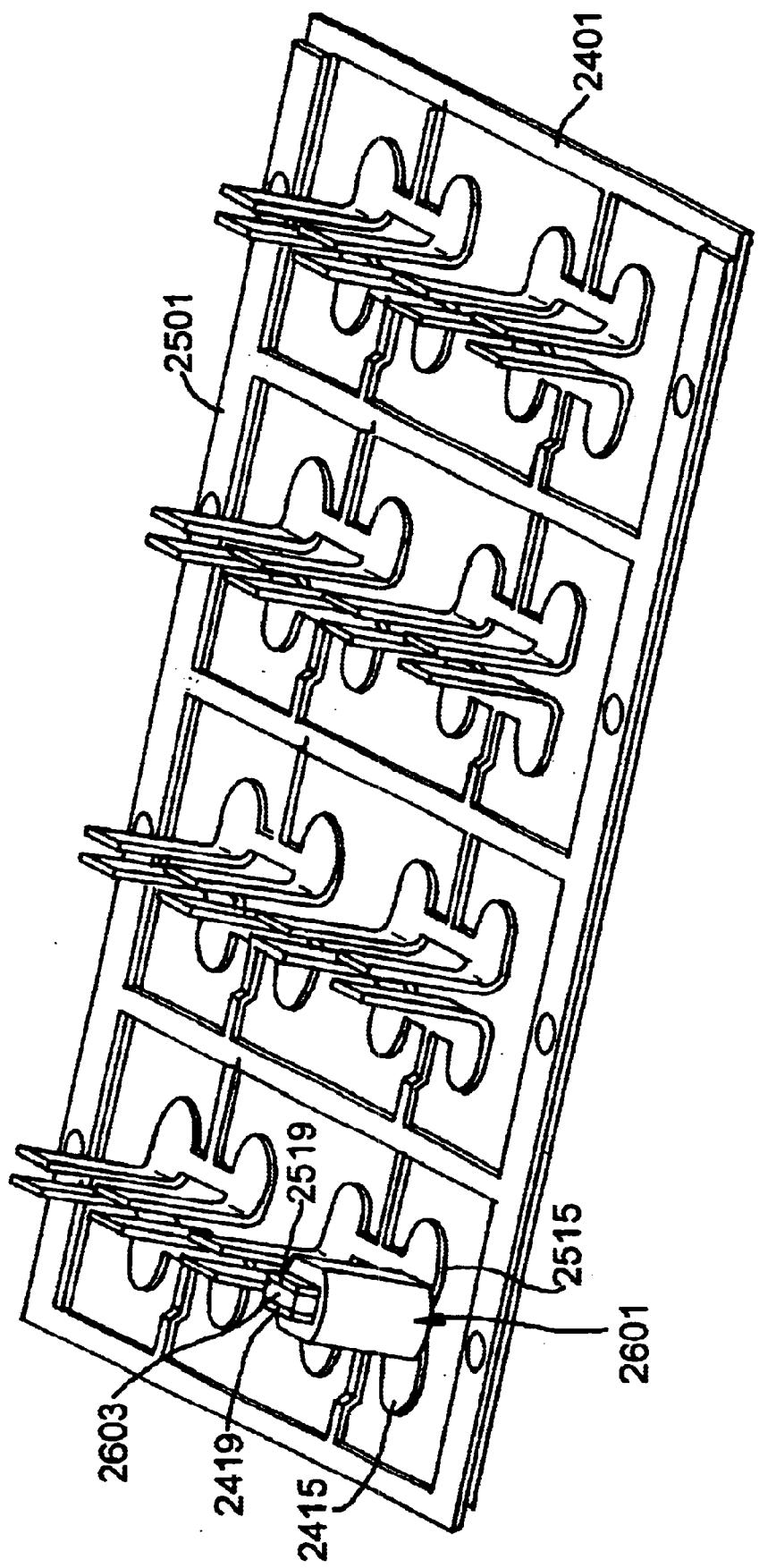
FIG. 26 is a plan view of a segment of the lead frame of FIG. 25 overlaid on top of a segment of the lead frame of FIG. 24 and a packaging unit formed around a portion of the first and second lead frames.

Referring now to FIGS. 24–26, another preferred embodiment is shown. First lead frame 2401 includes a plurality of lead frame segments 2403. Each lead frame segment includes a lead aperture 2405 defined by side portions which include a pair of side rails 2407 and crossbars 2409. Feeder holes 2411 are spaced along side rails 2407. Each lead frame sequence 2403 also includes a plurality of leads 2413 attached to the side portions and extending into lead aperture 2405. Leads 2413 preferably are substantially L-shaped with a base portion 2415 attached to a T-bar 2417, which in turn is attached to a crossbar 2409. The T-bars 2417, crossbar 2409 and base portions 2415 are substantially co-planar. Top portions 2419 of leads 2413 extend upwardly from an interior edge of base portion 2415.

Referring to FIG. 25, a second lead frame 2501 includes a plurality of lead frame segments 2503 that are substantially mirror images of lead frame segments 2403 of lead frame 2401. Each lead frame segment 2503 includes a plurality of leads 2513 that are substantially L-shaped and attached to a T-bar 2517 extending from a crossbar 2509. T-bar 2517 includes a down set section 2521. Down set section 2521 allows base portions 2415 to be aligned such that they are coplanar when lead frame 2501 is overlaid over 2401 during molding.

Referring to FIG. 26, when feeder holes 2411, 2511 are aligned, lead frame 2501 overlays lead frame 2401 and leads 2413 and 2415 are spaced apart. As described above for other preferred embodiments, molding material is then deposited on desired lead frame portions in a predetermined pattern to form an electronic device package 2601. Preferably, mold material is deposited partially on top portions 2419 and 2519. Base portions 2415, 2515 extend outwardly from the molded body at one end and a portion of top portions extend outwardly from molded body at an opposite end. A chip, thermoster, or other electronic device 2603 is preferably received between leads 2413 and 2513 and is electrically attached to both leads or either lead, such as by solder bonding.

One of ordinary skill in the art can envision numerous variations and modifications. For example, the reel feeding holes can be located at different positions, or the heat sink lead frame 901, 1601 can be overlaid on top of lead frames 801, 1401 respectively. All of these modifications are contemplated by the true spirit and scope of the following claims.

What is claimed is:

1. An automated method of fabricating electronic packaging units comprising the steps of providing a first substantially planar lead frame defining a first aperture and at least one first lead extending into the aperture; providing a second heat sink lead frame segment defining a second aperture and including at least one second lead extending into said second lead frame aperture, wherein the second lead is provided with at least one hole extending therethrough; overlaying the first lead frame segment and the second heat sink lead frame segment and positioning the first and second leads apart from each other by a distance defining a space; and riveting the first and second lead frame segments together with a deposit of flowable molding material into the space defined by the predetermined distance between the first lead and the second heat sink lead, the molding material flowing though the at least one hole in the second heat sink lead frame portion, thereby forming said molded body, wherein the molded body is structured to expose contact surfaces for each of the first lead and second lead.

2. The method of claim 1 wherein the second lead further includes an edge portion having raised step portions.

3. The method of claim 2 wherein the edge is provided with a notch.

4. The method of claim 3 wherein, during the deposit of the flowable molding material, the material flows around the step portions of the second lead frame heat sink portion to facilitate the fixing of the second lead frame portion within the molded body.

5. The method of claim 2 wherein, during the deposit of the flowable molding material, the material flows around the step portions of the second lead frame heat sink portion to facilitate the fixing of the second lead frame portion within the molded body.

6. The method of claim 5 wherein the first lead is substantially rectangular and includes a side provided with a flared portion.

7. The method of claim 1 wherein the first lead is substantially rectangular and includes a side provided with a flared portion.

8. The method of claim 1 wherein the space between the first and second leads is bounded by the flared portion of the first lead and the through holes and step portions of the second lead.

9. The method of claim 1 wherein the first and second leads are positioned in an overlapping arrangement.

10. The method of claim 9 wherein the electronic device is selected from the group consisting of a semiconductor and a microchip.

11. The method of claim 1 wherein the first and second leads are positioned in an tiered arrangement.

12. The method of claim 1 wherein the first and second lead frame segments include with side rails having guide holes positioned therein.

13. The method of claim 1 further comprised of the step of forming the molded body into a substantially rectangular shape defining a central cavity having a bottom cavity surface comprising the heat sink second lead and wherein the body includes a terraced sidewall arrangement which is comprised of the exposed contact surface of the first lead, the first lead having an end which extends out of the package, and wherein the central cavity is dimensioned to receive an electronic device.

14. The method of claim 1 further comprised of the steps of providing a feeder that includes feed pins, engaging holes provided in each of the first lead frame segment and the second heat sink segment with the feeder pins, moving the feeder pins to feed the lead frame segments to a molder, depositing a flowable molding material from the molder onto the lead frame segments, and hardening the molding material.

15. The method of claim 1 wherein the first lead and the second lead are each provided with arms extending from the side portions prongs which extend in a direction substantially perpendicular to the first lead and the second lead.

16. The method of claim 15 further comprised of the steps of providing a feeder that includes feed pins, engaging holes provided in each of the first lead frame segment and the second heat sink segment with the feeder pins, moving the feeder pins to feed the lead frame segments to a molder, depositing a flowable molding material from the molder onto the lead frame segments, and hardening the molding material.

17. An electronic packaging unit comprising a first substantially planar lead frame defining a first aperture and at least one first lead extending into the aperture, a second heat sink lead frame segment which includes a second lead defining a second aperture and including at least one second lead extending into said second lead frame aperture, wherein the second lead is provided with at least one hole extending therethrough; the first lead and the second heat sink lead positioned in an overlaying arrangement in which the first and second leads are spaced apart from each other; a molded body including a hardened molding material that, when deposited in a flowable state, enters the space between the first lead and the second heat sink lead, and flows though the at least one hole in the second heat sink lead frame portion, thereby fixing the first and second leads within the molded body, wherein the molded body is structured to expose contact surfaces for each of the first lead and second lead.

18. The electronic packaging unit of claim 17 wherein the second lead further includes an edge portion having raised step portions.

19. The electronic packaging unit of claim 18 wherein the edge is provided with a notch.

20. The electronic packaging unit of claim 19 wherein, during the deposit of the flowable molding material, the material flows around the step portions of the second lead to facilitate the fixing of the second lead frame portion within the molded body.

21. The electronic packaging unit of claim 20 wherein, during the deposit of the flowable molding material, the material flows around the step portions of the second lead frame heat sink portion to facilitate the fixing of the second lead frame portion within the molded body.

22. The electronic packaging unit of claim 17 wherein the first lead is substantially rectangular and includes a side provided with a flared portion.

23. The electronic packaging unit of claim 22 wherein the first lead is substantially rectangular and includes a side provided with a flared portion.

24. The electronic packaging unit of claim 17 wherein the space between the first and second leads is bounded by the flared portion of the first lead and the through holes and step portions of the second lead.

25. The electronic packaging unit of claim 17 wherein the first and second leads are positioned in an overlapping arrangement.

26. The electronic packaging unit of claim 17 wherein the first and second leads are positioned in a tiered arrangement.

27. The electronic packaging unit of claim 17 wherein the first and second lead frame segments include side rails having guide holes positioned therein.

28. The electronic packaging unit of claim 17 wherein the molded body has a substantially rectangular shape defining a central cavity having a bottom cavity surface comprising the heat sink second lead and wherein the body includes terraced sidewall arrangement which is comprised of the exposed contact surface of the first lead, the first lead having an end which extends out of the package, and wherein the central cavity is dimensioned to receive an electronic device.

29. The electronic packaging unit of claim 28 wherein the electronic device is selected from the group consisting of a semiconductor, and a microchip.

30. The electronic packaging unit of claim 17 wherein the first lead and the second lead are each provided with arms extending from the side portions to prongs which extend in a direction substantially perpendicular to the first lead and the second lead, wherein the prongs extend beyond the molded body.

* * * * *